(12) United States Patent
Jin et al.

(10) Patent No.: US 9,728,122 B2
(45) Date of Patent: Aug. 8, 2017

(54) ORGANIC LIGHT EMITTING DIODE DISPLAY

(71) Applicant: SAMSUNG DISPLAY CO., LTD., Yongin, Gyeonggi-do (KR)

(72) Inventors: Guang hai Jin, Yongin (KR); Dong-Gyu Kim, Yongin (KR); Kwan-Wook Jung, Yongin (KR); Moo-Jin Kim, Yongin (KR); Jee-Hoon Kim, Yongin (KR); Jun-Woo Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 245 days.

(21) Appl. No.: 14/046,745

(22) Filed: Oct. 4, 2013

(65) Prior Publication Data

US 2014/0098077 A1 Apr. 10, 2014

(30) Foreign Application Priority Data

Oct. 4, 2012 (KR) ......................... 10-2012-0110085

(51) Int. Cl.
*G09G 3/3225* (2016.01)
*H01L 27/32* (2006.01)
*G09G 3/3233* (2016.01)

(52) U.S. Cl.
CPC ....... *G09G 3/3225* (2013.01); *H01L 27/3265* (2013.01); *H01L 27/3276* (2013.01);
(Continued)

(58) Field of Classification Search
CPC .......... G09G 3/3225; G09G 5/00; G09G 3/30; G09G 3/006; H01J 1/62; H01L 27/3265; H01L 27/3276
(Continued)

(56) References Cited

U.S. PATENT DOCUMENTS

2007/0295962 A1* 12/2007 Choi et al. ................. 257/59
2008/0007492 A1* 1/2008 Koh .................... H01L 27/3213
345/76

(Continued)

FOREIGN PATENT DOCUMENTS

KR 10-0596467 B1 7/2006
KR 10-0710773 B1 4/2007
KR 10-2009-0109873 A 10/2009

OTHER PUBLICATIONS

Korean Patent Abstract, Publication No. 10-2001-0014476 A, dated Feb. 26, 2001 for corresponding Korean Patent 10-0710773 B1 listed above, 2 pages.

(Continued)

*Primary Examiner* — Fred Tzeng
(74) *Attorney, Agent, or Firm* — Lewis Roca Rothgerber Christie LLP

(57) ABSTRACT

An organic light emitting diode (OLED) display is disclosed. The OLED display includes a substrate, a scan line on the substrate and configured to transfer a scan signal, a data line crossing the scan line and configured to transfer a data signal, a driving voltage line crossing the scan line or the data line and configured to transfer a driving voltage, a switching thin film transistor (TFT) connected to the scan line and the data line, a driving TFT connected to the switching TFT and the driving voltage line, an OLED connected to the driving TFT, and a storage capacitor connected to the driving voltage line and a driving gate electrode of the driving TFT. The storage capacitor includes a first storage capacitor plate that overlaps the driving voltage line.

9 Claims, 4 Drawing Sheets

(52) U.S. Cl.
CPC ... *G09G 3/3233* (2013.01); *G09G 2300/0426* (2013.01); *G09G 2300/0465* (2013.01); *G09G 2300/0842* (2013.01)

(58) Field of Classification Search
USPC ........ 345/204, 76, 211; 313/504; 257/59, 66
See application file for complete search history.

(56) References Cited

U.S. PATENT DOCUMENTS

| | | | |
|---|---|---|---|
| 2009/0070995 A1* | 3/2009 | Kumagai | H01L 51/0004 29/846 |
| 2010/0025664 A1* | 2/2010 | Park | H01L 27/326 257/40 |
| 2010/0052517 A1* | 3/2010 | Kim | 313/504 |
| 2010/0090222 A1* | 4/2010 | Park et al. | 257/66 |
| 2011/0163661 A1* | 7/2011 | Lee | H01L 27/3227 313/504 |
| 2013/0271440 A1* | 10/2013 | Jin | G09G 3/006 345/211 |

OTHER PUBLICATIONS

Korean Patent Abstract, Publication No. 10-2005-0107865 A, dated Nov. 16, 2005 for corresponding Korean Patent 10-0596467 B1 listed above, 2 pages.

* cited by examiner

ORGANIC LIGHT EMITTING DIODE DISPLAY

CROSS-REFERENCE TO RELATED APPLICATIONS

This application claims priority to and the benefit of Korean Patent Application No. 10-2012-0110085, filed in the Korean Intellectual Property Office on Oct. 4, 2012, the entire content of which is incorporated herein by reference.

BACKGROUND

1. Field

Aspects of embodiments of the present invention relate generally to an organic light emitting diode (OLED) display.

2. Description of the Related Art

An OLED display includes two electrodes (for example, a pixel electrode and a common electrode) and an organic emission layer placed between the two electrodes. Electrons injected from one of the two electrodes (for example, the common electrode, or cathode) are combined with holes injected from the other of the two electrodes (for example, the pixel electrode, or anode) in the organic emission layer, thus forming excitons. The excitons emit light while radiating energy.

This OLED display may be classified into a front light emitting type, a rear light emitting type, or a double-side light emitting type depending on the direction that light emits from the organic emission layer. The pixel electrode or common electrode of the OLED display is made of a different material depending on each light emitting type. The front light emitting type may be problematic in that a voltage drop may occur in a large-sized OLED display because the common electrode is usually made of a transparent (e.g., high resistance) material. Accordingly, the rear light emitting type is usually used for a large-sized OLED display. The rear light emitting type, however, may be problematic in that an aperture ratio may be low because circuit wires that usually block light emission (such as a gate line, a data line, a driving voltage line, and others) do not overlap a pixel electrode that corresponds to a pixel area.

The above information disclosed in this Background section is only for enhancement of understanding of the background of the present invention and therefore it may contain information that does not form prior art that is already known in this country to a person of ordinary skill in the art.

SUMMARY

Embodiments of the present invention provide for an OLED display having an improved aperture ratio.

According to an exemplary embodiment of the present invention, an organic light emitting diode (OLED) display is provided. The OLED display includes a substrate, a scan line on the substrate and configured to transfer a scan signal, a data line crossing the scan line and configured to transfer a data signal, a driving voltage line crossing the scan line or the data line and configured to transfer a driving voltage, a switching thin film transistor (TFT) connected to the scan line and the data line, a driving TFT connected to the switching TFT and the driving voltage line, an OLED connected to the driving TFT, and a storage capacitor connected to the driving voltage line and a driving gate electrode of the driving TFT. The storage capacitor includes a first storage capacitor plate that overlaps the driving voltage line.

The driving voltage line may include a horizontal driving voltage line parallel to the scan line, and a vertical driving voltage line connected to the horizontal driving voltage line and parallel to the data line. The first storage capacitor plate may overlap the horizontal driving voltage line.

The first storage capacitor plate may connect to a switching drain electrode of the switching TFT. The storage capacitor may further include a second storage capacitor plate that overlaps the first storage capacitor plate and connects to the horizontal driving voltage line.

The first storage capacitor plate and a driving semiconductor layer of the driving TFT may include a first layer. The second storage capacitor plate and the scan line may include a second layer.

The horizontal driving voltage line may include the second layer. The vertical driving voltage line and the data line may include a third layer.

The horizontal driving voltage line may include a lower metal layer and an upper metal layer that are sequentially stacked.

The horizontal driving voltage line may include the second storage capacitor plate.

The second storage capacitor plate may include the lower metal layer and the upper metal layer having a storage capacitor opening that exposes the lower metal layer.

The lower metal layer may include a transparent conductive material. The upper metal layer may include tungsten, molybdenum, aluminum, or an alloy of them.

The OLED display may further include a gate insulating layer between the first storage capacitor plate and the second storage capacitor plate, and an interlayer insulating layer covering the second storage capacitor plate.

The second storage capacitor plate may completely overlap the first storage capacitor plate.

In accordance with embodiments of the present invention, a plate of the storage capacitor of an OLED display overlaps the horizontal driving voltage line. Accordingly, an area occupied by the storage capacitor can be reduced and a larger pixel opening can be formed, thereby improving an aperture ratio.

DETAILED DESCRIPTION

Figure 1:
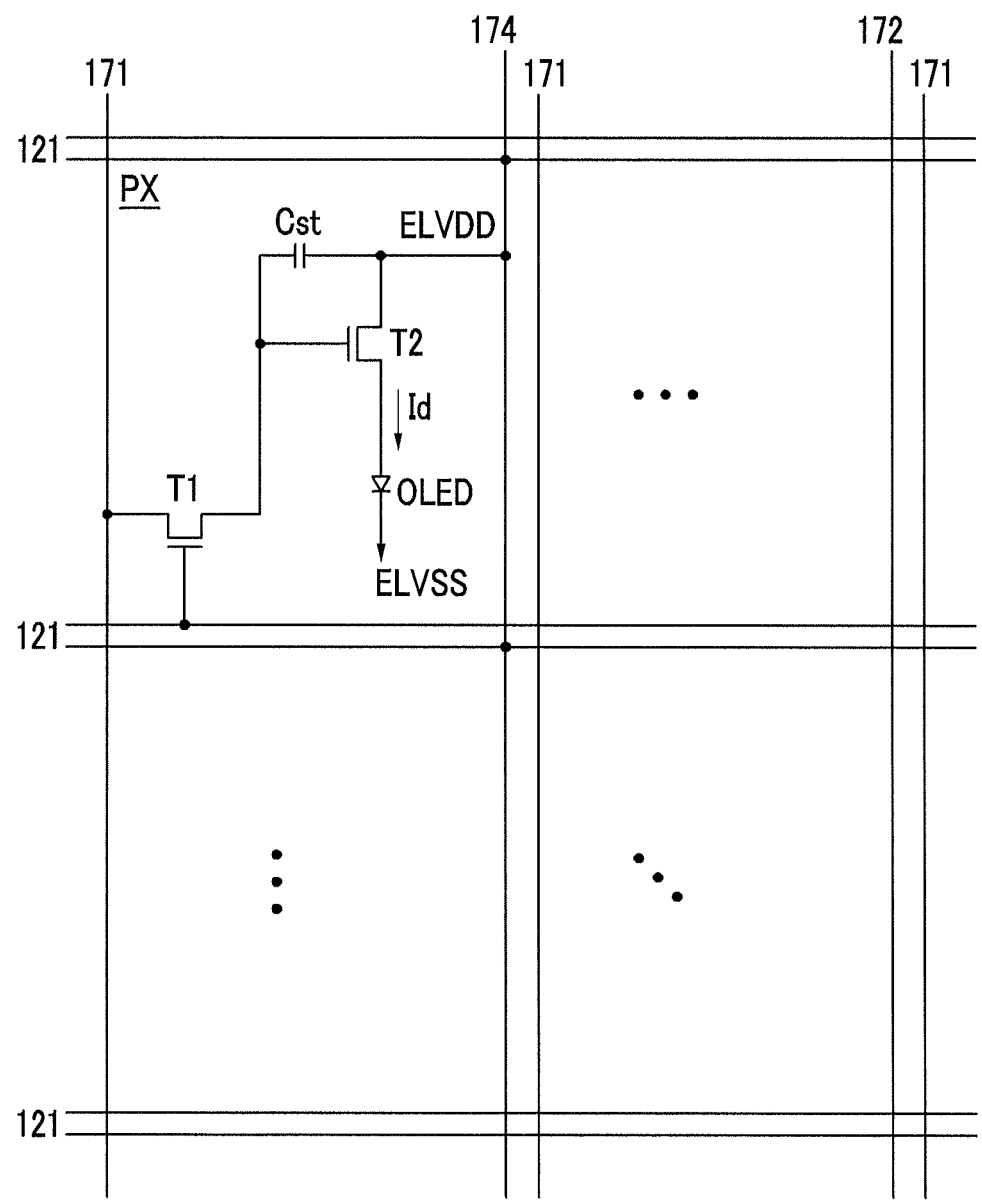
FIG. 1 is an equivalent circuit of an OLED display in accordance with an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. To help clarify a description of an embodiment of the present invention, parts not relevant to the invention may be omitted. In addition, the same reference numbers are used throughout the drawings to refer to the same or like parts.

The size or thickness of each element shown in the drawings may be arbitrarily enlarged for better understanding and convenience of description, but the present invention is not limited thereto. For example, the thickness of layers, films, panels, regions, etc., may be exaggerated for clarity. It will be understood that when an element such as a layer, film, region, or substrate is referred to as being "on" another element, it can be directly on the other element or intervening elements may also be present.

In addition, the accompanying drawings illustrate an active matrix (AM) type of OLED display having a two-transistor one-capacitor (2Tr-1 Cap) structure including two thin film transistors (TFTs) and one capacitor in one pixel, but the present invention is not limited thereto. In other embodiments, the OLED display may include two or more TFTs and at least one capacitor in one pixel. The OLED display may have a variety of structures in which an additional wire is further formed or from which an existing wire is omitted. Here, a pixel refers to a minimum unit for displaying an image. The OLED display displays an image through a plurality of the pixels.

An OLED display in accordance with an exemplary embodiment is described in detail below with reference to FIGS. 1 to 4.

Figure 2:
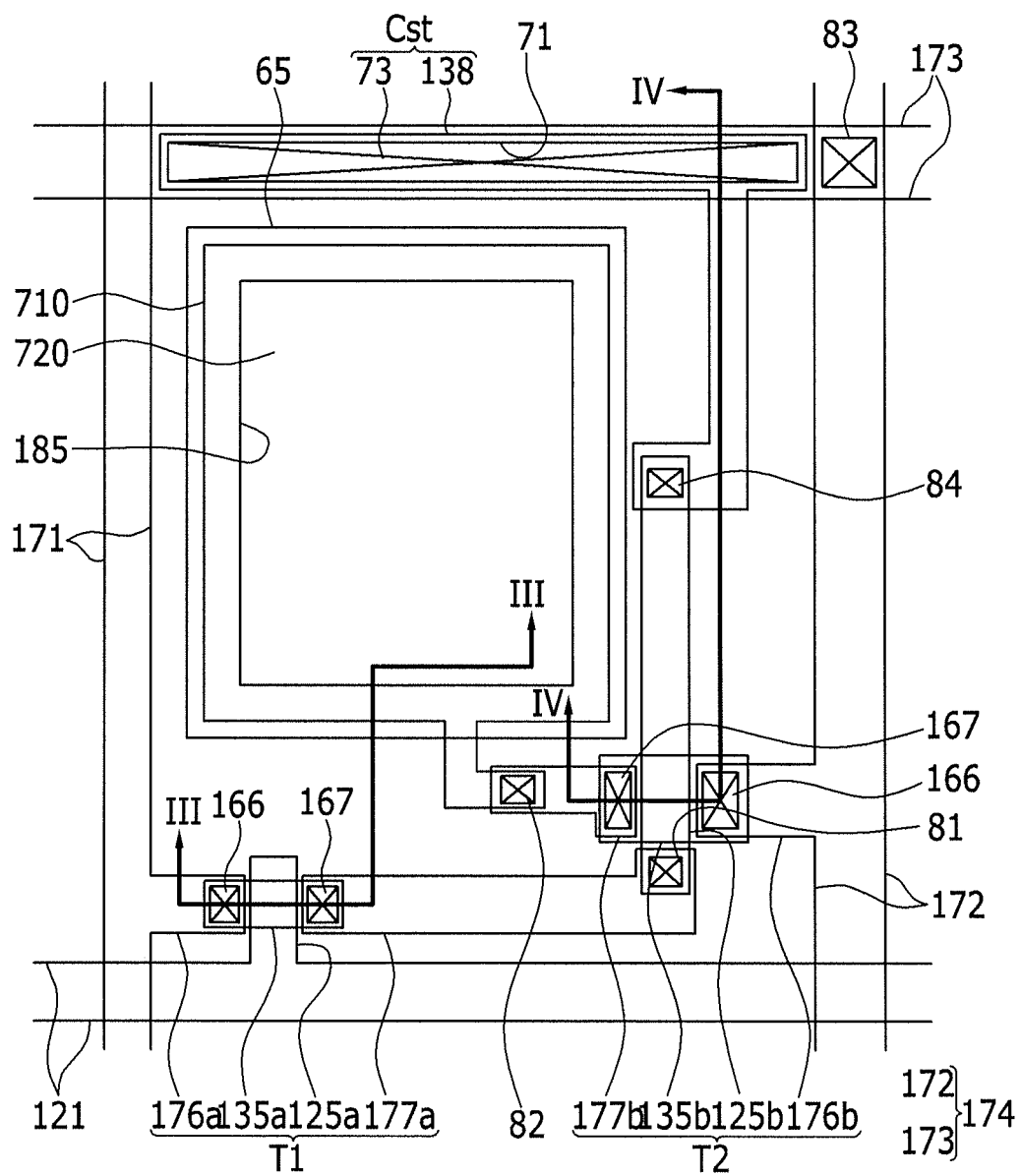
FIG. 2 is a layout view of one pixel of an OLED display in accordance with an exemplary embodiment.
Figure 3:
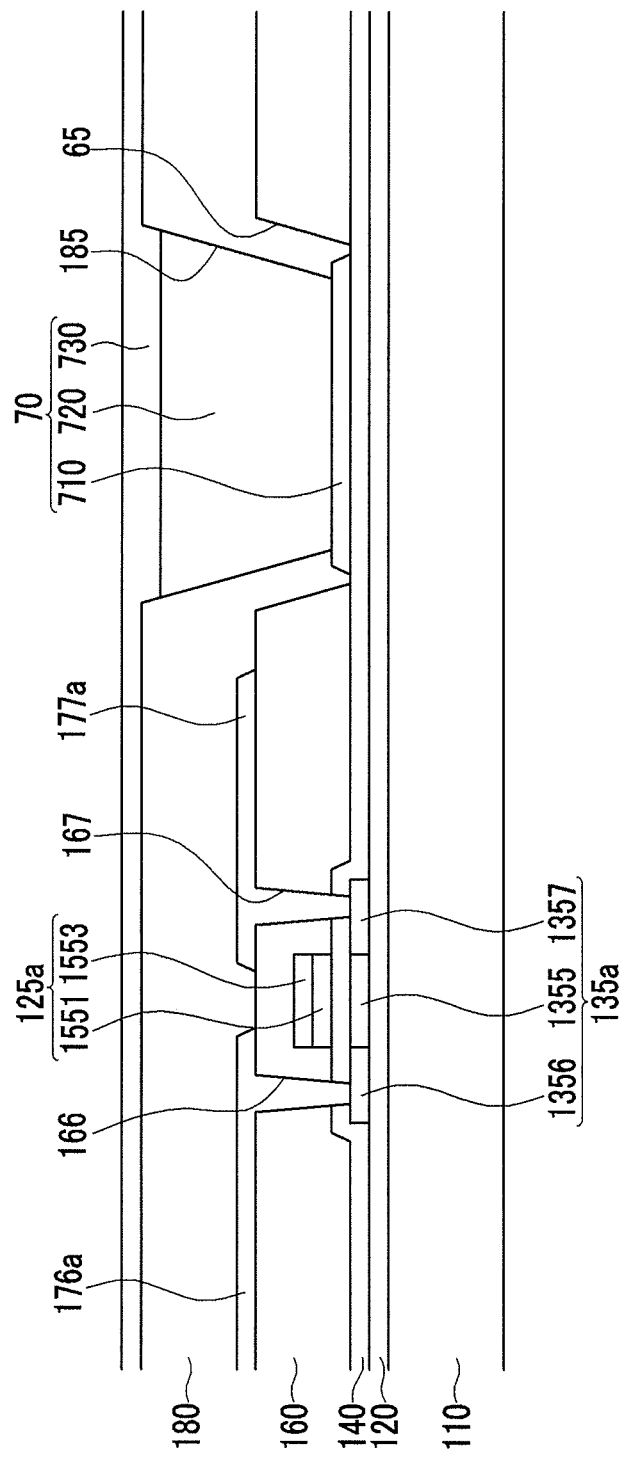
FIG. 3 is a cross-sectional view of the pixel of FIG. 2 taken along line III-III.
Figure 4:
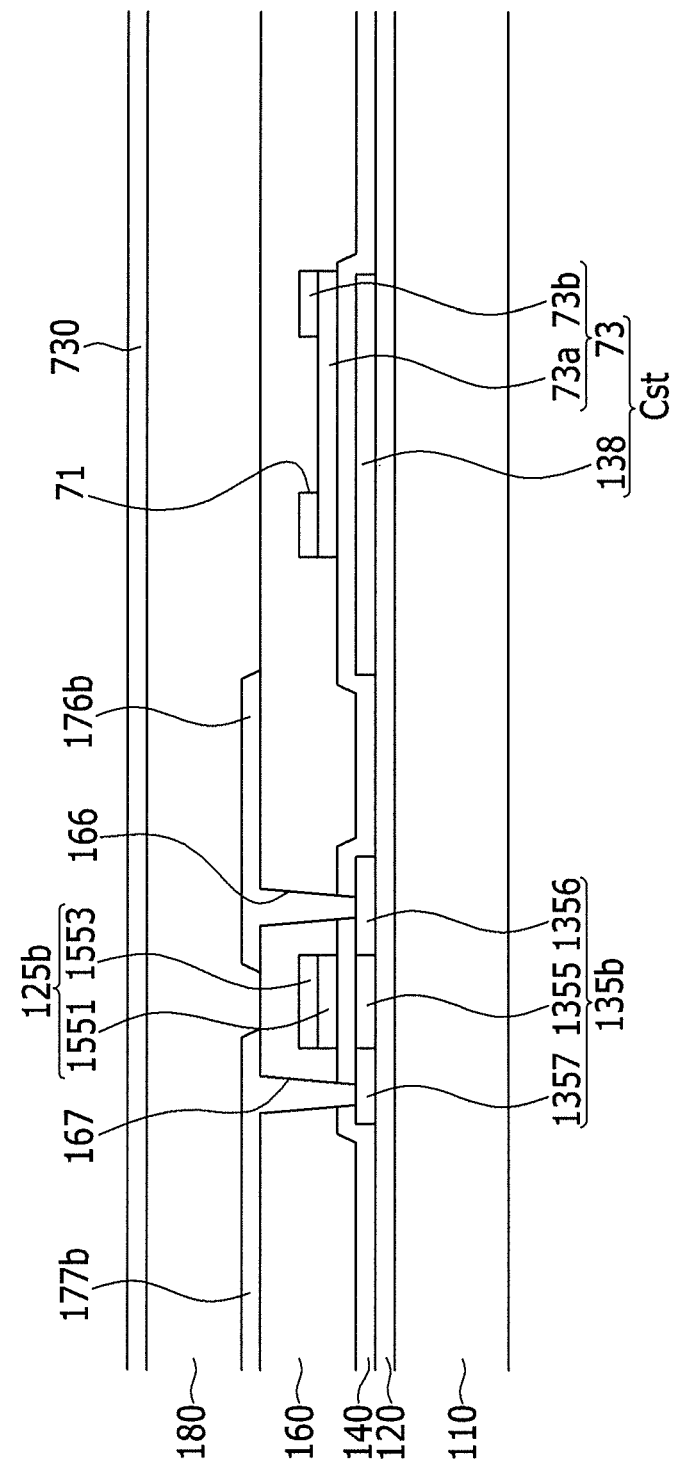
FIG. 4 is a cross-sectional view of the pixel of FIG. 2 taken along line IV-IV.

FIG. 1 is an equivalent circuit of an OLED display in accordance with an exemplary embodiment, FIG. 2 is a layout view of one pixel of an OLED display in accordance with an exemplary embodiment, FIG. 3 is a cross-sectional view of the pixel of FIG. 2 taken along line III-III, and FIG. 4 is a cross-sectional view of the pixel of FIG. 2 taken along line IV-IV.

As shown in FIG. 1, the OLED display includes a plurality of signal lines 121, 171, and 174, and a plurality of pixels PX connected to the signal lines 121, 171, and 174 and arranged in an approximately matrix form. The signal lines include a plurality of scan lines 121 for transferring scan signals (or gate signals), a plurality of data lines 171 for transferring data signals, and a plurality of driving voltage lines 174 for transferring a driving voltage ELVDD. The scan lines 121 are extended in an approximately row direction and are parallel or almost parallel to each other. The data lines 171 are extended in an approximately column direction and are parallel or almost parallel to each other. The driving voltage lines 174 include horizontal driving voltage lines 173 (refer to FIG. 2) parallel to the scan lines 121 and vertical driving voltage lines 172 (refer to FIG. 2) parallel to the data lines 171.

Each pixel PX includes a switching TFT T1, a driving TFT T2, a storage capacitor Cst, and an OLED. The switching TFT T1 includes a control terminal (such as a gate electrode), an input terminal (such as a source electrode), and an output terminal (such as a drain electrode). The control terminal of the switching TFT T1 connects to the scan line 121, the input terminal connects to the data line 171, and the output terminal connects to the driving TFT T2. The switching TFT T1 transfers a data signal applied to the data line 171 to the driving TFT T2 in response to a scan signal applied to the scan line 121.

The driving TFT T2 also includes a control terminal, an input terminal, and an output terminal. The control terminal of the driving TFT T2 connects to the switching TFT T1, the input terminal connects to the vertical driving voltage line 172, and the output terminal connects to the OLED. The driving TFT T2 controls the flow of an output current Id having a magnitude that varies depending on a voltage across the control terminal and the output terminal.

The storage capacitor Cst connects to the control terminal and the input terminal of the driving TFT T2. For example, one terminal or plate of the storage capacitor Cst may connect to the control terminal of the driving TFT T2 while another terminal or plate of the storage capacitor Cst may connect to the input terminal of the driving TFT T2. The storage capacitor Cst charges a data signal applied to the control terminal of the driving TFT T2 and maintains the charged data signal even after the switching TFT T1 turns off.

The OLED includes an anode connected to the output terminal of the driving TFT T2 and a cathode connected to a common voltage ELVSS. The OLED displays an image by emitting light whose intensity varies depending on the output current Id of the driving TFT T2.

The switching TFT T1 and the driving TFT T2 are depicted in FIG. 1 as n channel field effect transistors (FETs). In other embodiments, at least one of the switching TFT T1 and the driving TFT T2 may be a p channel FET. Furthermore, in other embodiments, a connection relationship between the TFTs T1 and T2, the capacitor Cst, and the OLED may be changed.

The structure of the pixel of the OLED display shown in FIG. 1 is described in further detail below with reference to FIGS. 1 and 2 to 4.

As shown in FIGS. 2 to 4, the OLED display includes a substrate 110. A buffer layer 120 is formed on the substrate 110. The substrate 110 can be, for example, an insulating substrate made of glass, quartz, ceramic, or plastic, or the substrate 110 can be a metallic substrate made of stainless steel. The buffer layer 120 may be formed, for example, to have a single film of silicon nitride (SiNx) or a dual-film structure having a stack of silicon nitride (SiNx) and silicon oxide ($SiO_2$). The buffer layer 120 helps prevent or reduce the infiltration of unnecessary components, such as impurities or moisture, and helps make a flat surface.

A switching semiconductor layer 135a, a driving semiconductor layer 135b, and a first storage capacitor plate 138 are formed on the buffer layer 120. The semiconductor layers 135a and 135b, and the first storage capacitor plate 138 can be made, for example, of polysilicon or an oxide semiconductor. The oxide semiconductor can include, for example, at least one of an oxide including zinc (Zn), gallium (Ga), tin (Sn), or indium (In) as a base, such as zinc oxide (ZnO), indium-gallium-zinc oxide ($InGaZnO_4$), indium-zinc oxide (Zn—In—O), or zinc-tin oxide (Zn—Sn—O), that is, complex oxides of zinc (Zn), gallium (Ga), tin (Sn), or indium (In). If the semiconductor layers 135a and 135b, and the first storage capacitor plate 138 are made of oxide semiconductors, an additional protection layer may be added to protect the oxide semiconductor that is vulnerable to the external environment, such as from a high temperature.

Each of the semiconductor layers 135a and 135b, and the first storage capacitor plate 138 includes a first region (for example, a channel region or a border region) into which impurities (for example, conductive impurities) have not been doped, and one or more other regions (for example, a source region and a drain region, or a plate region) into which impurities have been doped on one or more sides of the first region. The impurities are different depending on the type of TFT, and can be, for example, N type impurities or P type impurities.

Each of the switching semiconductor layer 135a and the driving semiconductor layer 135b includes a channel region 1355 as well as a source region 1356 and a drain region 1357 formed on respective sides of the channel region 1355. The channel region 1355 of each of the switching semiconductor layer 135a and the driving semiconductor layer 135b can include, for example, polysilicon into which impurities have not been doped, that is, an intrinsic semiconductor. The source region 1356 and the drain region 1357 of each of the switching semiconductor layer 135a and the driving semiconductor layer 135b can include, for example, polysilicon into which conductive impurities have been doped, that is, an impurity semiconductor.

The first storage capacitor plate 138 extends from the driving semiconductor layer 135b and overlaps (for example, coincides with) one of the horizontal driving voltage lines 173 (for example, in a vertical direction with respect to the substrate 110. A plate region of the first storage capacitor plate 138 can include, for example, polysilicon into which conductive impurities have been doped. The impurities doped into the source region 1356, the drain region 1357, and the plate region (of the first storage capacitor plate 138) can be, for example, p-type impurities or n-type impurities. The border region of the first storage capacitor plate 138 can include, for example, polysilicon into which impurities have not been doped.

A gate insulating layer 140 is formed on the switching semiconductor layer 135a, the driving semiconductor layer 135b, and the first storage capacitor plate 138. The gate insulating layer 140 can be, for example, a single layer or a plurality of layers, including at least one of silicon nitride (SiNx) and silicon oxide (SiO$_2$).

The scan lines 121, a driving gate electrode 125b, the horizontal driving voltage lines 173, and a pixel electrode 710 are formed over the gate insulating layer 140. The scan line 121 extends in a horizontal direction, transfers a scan signal, and includes a switching gate electrode 125a protruded from the scan line 121 to overlap the channel region 1355 of the switching semiconductor layer 135a. The horizontal driving voltage line 173 also extends in a horizontal direction, and forms a second storage capacitor plate 73 where the horizontal driving voltage line 173 overlaps (for example, coincides with) the first storage capacitor plate 138.

The switching gate electrode 125a and the driving gate electrode 125b overlap the channel region 1355 of the switching TFT T1 and the driving TFT T2, respectively. Each of the switching gate electrode 125a and the driving gate electrode 125b includes a lower metal layer 1551 and an upper metal layer 1553. The lower metal layer 1551 can be made, for example, of indium tin oxide (ITO), indium zinc oxide (IZO), or zinc oxide (ZnO), that is, a transparent conductive material. The upper metal layer 1553 can have, for example, a single layer or a plurality of layers made of tungsten, molybdenum, aluminum, or an alloy of them.

The second storage capacitor plate 73 includes a lower metal layer 73a and an upper metal layer 73b. The upper metal layer 73b includes a storage capacitor opening 71 exposing the lower metal layer 73a. Conductive impurities can be doped into the plate region of the first storage capacitor plate 138 through the storage capacitor opening 71. The first storage capacitor plate 138 connects to the driving gate electrode 125b. The lower metal layer 73a is made of the same material as the lower metal layer 1551 of the driving gate electrode 125b. The upper metal layer 73b is made of the same material as the upper metal layer 1553 of the driving gate electrode 125b. The first storage capacitor plate 138 and the second storage capacitor plate 73 form a storage capacitor Cst using the gate insulating layer 140 as a dielectric material. The plate region of the first storage capacitor plate 138 can have a smaller width than (for example, be completely overlapped by) the second storage capacitor plate 73.

The pixel electrode 710 is made of a transparent conductive material and is made of the same material as the lower metal layer 1551 of the driving gate electrode 125b. The pixel electrode 710 connects to the driving drain electrode 177b of the driving TFT T1, thus becoming the anode of the OLED.

The pixel electrode 710 can be formed in the same process as the switching gate electrode 125a and the driving gate electrode 125b. As illustrated in the exemplary embodiment of FIGS. 3-4, the pixel electrode 710 is placed under (e.g., at a lower level or in an earlier layer than) the switching source electrode 176a and driving source electrode 176b as well as the switching drain electrode 177a and driving drain electrode 177b.

An interlayer insulating layer 160 is formed over the scan lines 121 (including the switching gate electrode 125a), the driving gate electrode 125b, and the horizontal driving voltage lines 173 (including the second storage capacitor plate 73). The interlayer insulating layer 160, like the gate insulating layer 140, can be made of silicon nitride (SiNx) or silicon oxide (SiO$_2$).

An opening 65 exposing the pixel electrode 710 is formed in the interlayer insulating layer 160. A source contact hole 166 and a drain contact hole 167 through which the source region 1356 and the drain region 1357 are exposed, respectively, are formed in the interlayer insulating layer 160 and the gate insulating layer 140.

The data line 171 (including the switching source electrode 176a), the vertical driving voltage line 172 (including the driving source electrode 176b), the switching drain electrode 177a, and the driving drain electrode 177b are formed on the interlayer insulating layer 160. The data line 171 transfers a data signal and extends in a direction crossing the gate line 121. The vertical driving voltage line 172 transfers the driving voltage ELVDD. In addition, the vertical driving voltage line 172 is separated from and extends in the same direction as the data line 171. The vertical driving voltage line 172 connects to the horizontal driving voltage line 173 through a contact hole 83 formed in the interlayer insulating layer 160.

The switching source electrode 176a protrudes from the data line 171 toward the switching TFT T1 to overlap the source region 1356 of the switching semiconductor layer 135a. The driving source electrode 176b protrudes from the vertical driving voltage line 172 toward the driving TFT T2 to overlap the source region 1356 of the driving semiconductor layer 135b. The switching source electrode 176a and the driving source electrode 176b are connected to the source region 1356 of their respective TFTs T1 and T2 through the source contact holes 166. The switching drain electrode 177a faces the switching source electrode 176a, the driving drain electrode 177b faces the driving source electrode 176b, and the switching drain electrode 177a and the driving drain electrode 177b are connected to the drain region 1357 of their respective TFTs T1 and T2 through the drain contact holes 167.

The switching drain electrode 177a extends along the gate line 121 and electrically connects to the driving gate electrode 125b through a contact hole 81 formed in the interlayer insulating layer 160. The driving gate electrode 125b extends and electrically connects to the first storage capacitor plate 138 through a contact hole 84 formed in the gate insulating layer 140. The driving drain electrode 177b electrically connects to the pixel electrode 710 through a contact hole 82 formed in the interlayer insulating layer 160.

Since the plate region of the first storage capacitor plate 138 of the storage capacitor Cst overlaps the horizontal driving voltage line 173 as described above, an area occupied by the storage capacitor Cst can be reduced. Accordingly, an aperture ratio can be improved because a pixel opening 185 can be formed widely.

The switching semiconductor layer 135a, the switching gate electrode 125a, the switching source electrode 176a, and the switching drain electrode 177a form the switching TFT T1. The driving semiconductor layer 135b, the driving gate electrode 125b, the driving source electrode 176b, and the driving drain electrode 177b form the driving TFT T2.

A pixel definition film 180 is formed on the switching source electrode 176a, the driving source electrode 176b, the switching drain electrode 177a, and the driving drain electrode 177b. The pixel definition film 180 includes the pixel opening 185 exposing the pixel electrode 710. The pixel definition film 180 may include, for example, a resin such as a polyacrylate or a polyimide, and a silica-based inorganic substance. An additional organic film can be formed between the pixel definition film 180 and the switching source electrode 176a, the driving source electrode 176b, the switching drain electrode 177a, and the driving drain electrode 177b to make a flat surface.

An organic emission layer 720 is formed in the pixel opening 185 of the pixel definition film 180. The organic emission layer 720 includes a plurality of layers including one or more of an emission layer, a hole injection layer (HIL), a hole transport layer (HTL), an electron transport layer (ETL), and an electron injection layer (EIL). If the organic emission layer 720 includes all of them, the hole injection layer (HIL) can be placed on the pixel electrode 710, that is, the anode, and the hole transport layer (HTL), the emission layer, the electron transport layer (ETL), and the electron injection layer (EIL) can be sequentially stacked over the hole injection layer (HIL).

The organic emission layer 720 can include a red organic emission layer for emitting red light, a green organic emission layer for emitting green light, and a blue organic emission layer for emitting blue light. The red organic emission layer, the green organic emission layer, and the blue organic emission layer are formed in respective red, green, and blue pixels, thereby implementing a color image.

In other embodiments, the organic emission layer 720 can implement a color image by forming all of the red organic emission layer, the green organic emission layer, and the blue organic emission layer in the red pixel, the green pixel, and the blue pixel and forming a red color filter, a green color filter, and a blue color filter for each pixel. In still other embodiments, the organic emission layer 720 may implement a color image by forming a white organic emission layer for emitting white light in all of the red pixels, the green pixels, and the blue pixels and forming a corresponding red color filter, green color filter, or blue color filter for each pixel. Displaying a color image by using a white organic emission layer and color filters may improve resolution because deposition masks for forming each of the red organic emission layer, the green organic emission layer, and the blue organic emission layer do not need to be used.

A common electrode 730 is formed over the pixel definition film 180 and the organic emission layer 720. The common electrode 730 can be a reflective layer or a semi-transmissive layer made of a reflective material. The reflective material forming the reflective layer or the semi-transmissive layer can be one or more of magnesium (Mg), silver (Ag), gold (Au), calcium (Ca), lithium (Li), chromium (Cr), and aluminum (Al), or an alloy of them. The common electrode 730 becomes the cathode of the OLED and supplies the common voltage ELVSS. The pixel electrode 710, the organic emission layer 720, and the common electrode 730 form an OLED 70.

While the present invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

| <Description of Some Symbols> | |
|---|---|
| 110: substrate | 73: second storage capacitor plate |
| 121: scan line | 140: gate insulating layer |
| 160: interlayer insulating layer | 171: data line |
| 172: vertical driving voltage line | 173: horizontal driving voltage line |
| 710: pixel electrode | 720: organic emission layer |
| 730: common electrode | 138: first storage capacitor plate |

What is claimed is:

1. An organic light emitting diode (OLED) display comprising:
    a substrate;
    a scan line on the substrate and configured to transfer a scan signal;
    a data line crossing the scan line and configured to transfer a data signal;
    a first driving voltage line crossing the scan line, parallel to the data line, and configured to transfer a driving voltage;
    a second driving voltage line crossing the data line and the first driving voltage line, parallel to the scan line, and disposed in a different layer from, and electrically connected to, the first driving voltage line;
    a switching thin film transistor (TFT) connected to the scan line and the data line;
    a driving TFT connected to the switching TFT and the first driving voltage line;
    an OLED connected to the driving TFT; and
    a storage capacitor comprising:
        a first storage capacitor plate; and
        a second storage capacitor plate that comprises a lower metal layer, and an upper metal layer contacting the lower metal layer and having a storage capacitor opening that overlaps the lower metal layer,
    wherein the second driving voltage line overlaps with, and is electrically insulated from, the first storage capacitor plate that is electrically connected to a driving gate electrode of the driving TFT.

2. The OLED display of claim 1, wherein
    the first storage capacitor plate connects to a switching drain electrode of the switching TFT, and
    the second storage capacitor plate overlaps the first storage capacitor plate and electrically connects to or is formed from the second driving voltage line.

3. The OLED display of claim 2, wherein
    the first storage capacitor plate and a driving semiconductor layer of the driving TFT comprise a first layer, and
    the second storage capacitor plate and the scan line comprise a second layer.

4. The OLED display of claim 3, wherein
the second driving voltage line comprises the second layer, and
the first driving voltage line and the data line comprise a third layer.

5. The OLED display of claim 4, wherein the second driving voltage line comprises the lower metal layer and the upper metal layer that are sequentially stacked.

6. The OLED display of claim 5, wherein the second driving voltage line comprises the second storage capacitor plate.

7. The OLED display of claim 2, further comprising:
a gate insulating layer between the first storage capacitor plate and the second storage capacitor plate; and
an interlayer insulating layer covering the second storage capacitor plate.

8. The OLED display of claim 2, wherein the second storage capacitor plate completely overlaps the first storage capacitor plate.

9. The OLED display of claim 1, wherein
the lower metal layer comprises a transparent conductive material, and
the upper metal layer comprises tungsten, molybdenum, aluminum, or an alloy of them.

* * * * *